United States Patent
Zhang et al.

(10) Patent No.: US 9,337,268 B2
(45) Date of Patent: May 10, 2016

(54) SIC DEVICES WITH HIGH BLOCKING VOLTAGE TERMINATED BY A NEGATIVE BEVEL

(75) Inventors: Qingchun Zhang, Cary, NC (US);
Craig Capell, Hillsborough, NC (US);
Anant Agarwal, Chapel Hill, NC (US);
Sei-Hyung Ryu, Cary, NC (US)

(73) Assignee: Cree, Inc., Durham, NC (US)

( * ) Notice: Subject to any disclaimer, the term of this patent is extended or adjusted under 35 U.S.C. 154(b) by 647 days.

(21) Appl. No.: 13/108,366

(22) Filed: May 16, 2011

(65) Prior Publication Data

US 2012/0292636 A1    Nov. 22, 2012

(51) Int. Cl.
| | |
|---|---|
| *H01L 29/06* | (2006.01) |
| *H01L 29/10* | (2006.01) |
| *H01L 29/36* | (2006.01) |
| *H01L 29/732* | (2006.01) |
| *H01L 29/739* | (2006.01) |

(Continued)

(52) U.S. Cl.
CPC ........ *H01L 29/1016* (2013.01); *H01L 29/0661* (2013.01); *H01L 29/1004* (2013.01); *H01L 29/1095* (2013.01); *H01L 29/36* (2013.01); *H01L 29/732* (2013.01); *H01L 29/7397* (2013.01); *H01L 29/74* (2013.01); *H01L 29/7813* (2013.01); *H01L 29/861* (2013.01); *H01L 29/0615* (2013.01); *H01L 29/1608* (2013.01)

(58) Field of Classification Search
CPC .................. H01L 29/0661; H01L 29/1608
USPC .................... 257/496, 493, E29.012
See application file for complete search history.

(56) References Cited

U.S. PATENT DOCUMENTS

| | | | |
|---|---|---|---|
| 4,648,174 | A | 3/1987 | Temple et al. |
| 4,672,738 | A | 6/1987 | Stengl et al. |

(Continued)

FOREIGN PATENT DOCUMENTS

| | | |
|---|---|---|
| WO | 9708754 A2 | 3/1997 |
| WO | 2007143008 A2 | 12/2007 |
| WO | 2011120979 A1 | 10/2011 |

OTHER PUBLICATIONS

Yu, H. et al., "An IGBT and MOSFET gated SiC bipolar junction transistor," Conference Record of the 2002 IEEE Industry Applications Conference, vol. 4, Oct. 13-18, 2002, pp. 2609-2613.

(Continued)

*Primary Examiner* — Amar Movva
(74) *Attorney, Agent, or Firm* — Anthony J. Josephson

(57) ABSTRACT

A negative bevel edge termination for a Silicon Carbide (SiC) semiconductor device is disclosed. In one embodiment, the negative bevel edge termination includes multiple steps that approximate a smooth negative bevel edge termination at a desired slope. More specifically, in one embodiment, the negative bevel edge termination includes at least five steps, at least ten steps, or at least 15 steps. The desired slope is, in one embodiment, less than or equal to fifteen degrees. In one embodiment, the negative bevel edge termination results in a blocking voltage for the semiconductor device of at least 10 kilovolts (kV) or at least 12 kV. The semiconductor device is preferably, but not necessarily, a thyristor such as a power thyristor, a Bipolar Junction Transistor (BJT), an Insulated Gate Bipolar Transistor (IGBT), a U-channel Metal-Oxide-Semiconductor Field Effect Transistor (UMOSFET), or a PIN diode.

29 Claims, 12 Drawing Sheets

(51) Int. Cl.
*H01L 29/74* (2006.01)
*H01L 29/78* (2006.01)
*H01L 29/861* (2006.01)
*H01L 29/16* (2006.01)

(56) References Cited

U.S. PATENT DOCUMENTS

| | | | |
|---|---|---|---|
| 5,552,625 | A | 9/1996 | Murakami et al. |
| 5,914,500 | A | 6/1999 | Bakowski et al. |
| 5,967,795 | A | 10/1999 | Bakowsky et al. |
| 5,970,324 | A | 10/1999 | Driscoll |
| 5,977,605 | A * | 11/1999 | Bakowsky et al. ............ 257/496 |
| 6,469,359 | B2 | 10/2002 | Bakowski et al. |
| 7,345,310 | B2 | 3/2008 | Agarwal et al. |
| 7,372,087 | B2 * | 5/2008 | Chen et al. .................... 257/263 |
| 7,498,651 | B2 | 3/2009 | Van Zeghbroeck |
| 7,759,186 | B2 | 7/2010 | Imhoff et al. |
| 7,838,377 | B2 | 11/2010 | Zhang et al. |
| 2007/0080422 | A1 | 4/2007 | Falck et al. |
| 2007/0145378 | A1 * | 6/2007 | Agarwal et al. ................ 257/77 |
| 2009/0134402 | A1 | 5/2009 | Yatsuo et al. |
| 2010/0055882 | A1 | 3/2010 | Imhoff et al. |
| 2012/0218796 | A1 | 8/2012 | Okamoto |
| 2013/0020611 | A1 * | 1/2013 | Gumaelius .................... 257/183 |

OTHER PUBLICATIONS

Invitation to Pay Additional Fees and, Where Applicable, Protest Fee for PCT/US2012/037215 mailed Jul. 20, 2012, 8 pages.
Baliga, B. J., "Fundamentals of Power Semiconductor Devices", Springer Science, 2008, pp. 653; 208; 211.
Reza Ghandi et al., "High-Voltage 4H-SiC PiN Diodes With Etched Junction Termination Extension," IEEE Electron Device Letters, vol. 30, No. 11, Nov. 2009, pp. 1170-1172.
X. Li et al., "Multistep junction termination extension for SiC power devices," Electronics Letters, vol. 37, No. 6, Mar. 15, 2001, pp. 392-393.
International Search Report and Written Opinion for PCT/US2012/037215 mailed Sep. 25, 2012, 19 pages.
Agarwal, A. et al., "Prospects of bipolar power devices in silicon carbide," 34th Annual Conference of Industrial Electronics, Nov. 10, 2008, pp. 2879-2884.
Matsuura, H. et al., "Mechanisms of reduction in hole concentration in Al-doped 4H-SiC by 200 keV electron irradiation," JAEA Review, Japan Atomic Energy Agency, vol. 2009-041, Dec. 1, 2009, pp. 14.
Restriction Requirement for U.S. Appl. No. 13/366,658, mailed Jul. 16, 2013, 5 pages.
Hiyoshi, T. et al., "Bevel Mesa Combined with Implanted Junction Termination Structure for 10 kV SiC PiN Diodes," Materials Science Forum, vol. 600-603, Oct. 14, 2007, pp. 995-998.
Kimoto, Tsunenobu et al., "Enhancement of Carrier Lifetimes in n-Type 4H-SiC Epitaxial Layers by Improved Surface Passivation," Applies Physics Express, vol. 3, Dec. 10, 2010, 3 pages.
International Search Report and Written Opinion for PCT/US2013/024740, mailed Jun. 14, 2013, 12 pages.
International Preliminary Report on Patentability for PCT/US2012/037215, mailed Nov. 28, 2013, 11 pages.
Non-Final Office Action for U.S. Appl. No. 13/366,658, mailed Nov. 25, 2013, 7 pages.
Final Office Action for U.S. Appl. No. 13/366,658, mailed Jul. 11, 2014, 10 pages.
International Preliminary Report on Patentability for PCT/US2013/024740, mailed Aug. 21, 2014, 8 pages.
Office Action of the Intellectual Property Office for Taiwainese Patent Application No. 101117452, issued Jan. 22, 2015, 16 pages.
Notice of Allowance for U.S. Appl. No. 13/366,658, mailed Jan. 30, 2015, 8 pages.
Stengl, R., et al., "Variation of Lateral Doping—A New Concept to Avoid High Voltage Breakdown of Planar Junctions," 1985 International Electron Devices Meeting, vol. 31, 1985, pp. 154-157.
International Search Report and Written Opinion for PCT/US2014/041680, mailed Sep. 9, 2014, 10 pages.
Notice of Allowance for U.S. Appl. No. 13/366,658, mailed Apr. 16, 2015, 7 pages.
Non-Final Office Action for U.S. Appl. No. 13/968,740, mailed Apr. 20, 2015, 10 pages.
Notice of Allowance for U.S. Appl. No. 13/366,658, mailed Aug. 3, 2015, 7 pages.
Final Office Action for U.S. Appl. No. 13/968,740, mailed Aug. 4, 2015, 14 pages.
Notice of Allowance for U.S. Appl. No. 13/366,658, mailed Jan. 15, 2016, 7 pages.
Advisory Action for U.S Appl. No. 13/968,740, mailed Nov. 20, 2015, 3 pages.
Examination Report for European Patent Application No. 12724225.3, mailed Dec. 4, 2015, 5 pages.
European Patent Office Communication for European Patent Application No. 12724225.3, mailed Dec. 10, 2015, 4 pages.
International Preliminary Report on Patenability for International Patent Application No. PCT/US2014/041680, mailed Feb. 25, 2016, 8 pages.
First Office Action for Chinese Patent Application No. 201280035253.1, issued Jan. 12, 2016, 21 pages.

* cited by examiner

US 9,337,268 B2

SIC DEVICES WITH HIGH BLOCKING VOLTAGE TERMINATED BY A NEGATIVE BEVEL

GOVERNMENT SUPPORT

This invention was made with government funds under contract number DAAD19-01-C-0067 Task Order 4 awarded by the U.S. Army. The U.S. Government may have rights in this invention.

FIELD OF THE DISCLOSURE

The present disclosure relates to semiconductor devices fabricated in Silicon Carbide (SiC) and more specifically relates to a negative bevel edge termination for a SiC device.

BACKGROUND

Silicon Carbide (SiC) is a desirable material for high-power and high-temperature semiconductor devices due to its high breakdown field, high thermal conductivity, and wide bandgap. However, to take advantage of the high breakdown field in a high-voltage device, an efficient edge termination is needed. More specifically, field crowding at the edge of the device results in device breakdown at the edge of the device, which in turn decreases the blocking voltage of the device well below the ideal blocking voltage (i.e., the blocking voltage of the ideal parallel-plane device). Thus, edge termination is an important issue in the design of SiC semiconductor devices and particularly for high-power SiC semiconductor devices.

One type of edge termination utilized for SiC semiconductor devices is a Junction Termination Extension (JTE). FIG. 1 illustrates an exemplary SiC semiconductor device, namely, a thyristor 10 that includes a number of JTE wells 12, 14, and 16. The thyristor 10 includes a substrate 18, an injection layer 20, a field stop layer 22, a drift layer 24, a base layer 26, and an anode layer 28. In order to form the JTE wells 12, 14, and 16, the base layer 26 is etched down to the drift layer 24 as illustrated. The JTE wells 12, 14, and 16 are then formed by ion implantation into an exposed surface of the drift layer 24. An anode contact 30 is formed on the anode layer 28, a cathode contact 32 is formed on a bottom surface of the substrate 18 opposite the injection layer 20, and gate contacts 34 and 36 are formed on corresponding gate regions 38 and 40 in the base layer 26. As a result of the etching of the base layer 26 down to the drift layer 24 to form the JTE wells 12, 14, and 16, a corner 42 is formed. The corner 42 causes electric field crowding, which in turn decreases the blocking voltage of the thyristor 10 to less than the ideal blocking voltage.

Thus, there is a need for an edge termination for a SiC semiconductor device that results in a blocking voltage that approaches the ideal blocking voltage for the ideal parallel-plane device.

SUMMARY

The present disclosure relates to a negative bevel edge termination for a Silicon Carbide (SiC) semiconductor device. In one embodiment, the negative bevel edge termination includes multiple steps that approximate a smooth negative bevel edge termination at a desired slope. More specifically, in one embodiment, the negative bevel edge termination includes at least five steps. In another embodiment, the negative bevel edge termination includes at least ten steps. In yet another embodiment, the negative bevel edge termination includes at least fifteen steps. The desired slope is, in one embodiment, less than or equal to 15 degrees. In one embodiment, the negative bevel edge termination results in a blocking voltage for the semiconductor device of at least 10 kilovolts (kV). In another embodiment, the negative bevel edge termination results in a blocking voltage for the semiconductor device of at least 12 kV. The semiconductor device is preferably, but not necessarily, a thyristor such as a power thyristor, a Bipolar Junction Transistor (BJT), an Insulated Gate Bipolar Transistor (IGBT), a U-channel Metal-Oxide-Semiconductor Field Effect Transistor (UMOSFET), or a PIN diode. Further, in one embodiment, the semiconductor device has a die area greater than or equal to one centimeter squared.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 3:
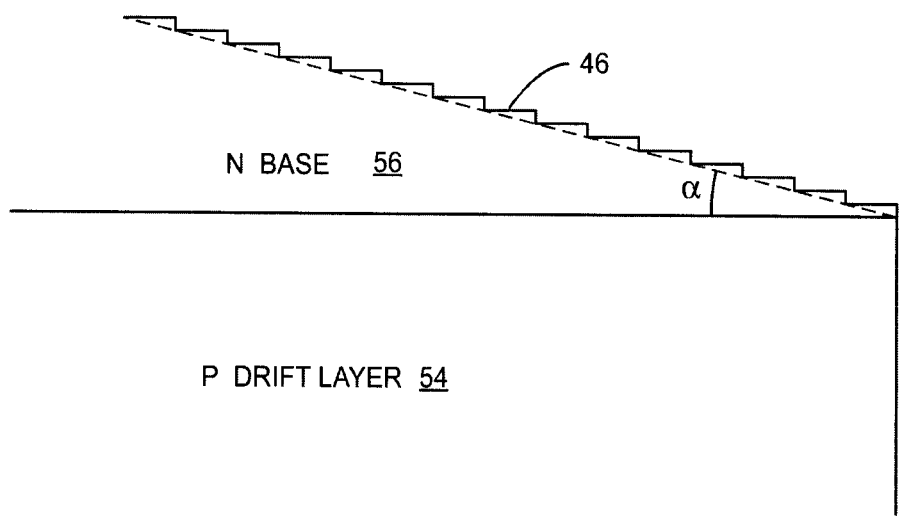
FIG. 3 illustrates the negative bevel edge termination of FIG. 2 in more detail where negative bevel edge termination is implemented as a multi-step negative bevel edge termination that includes a number of steps formed on a surface of a corresponding semiconductor layer according to one embodiment of the present disclosure.
Figure 4:
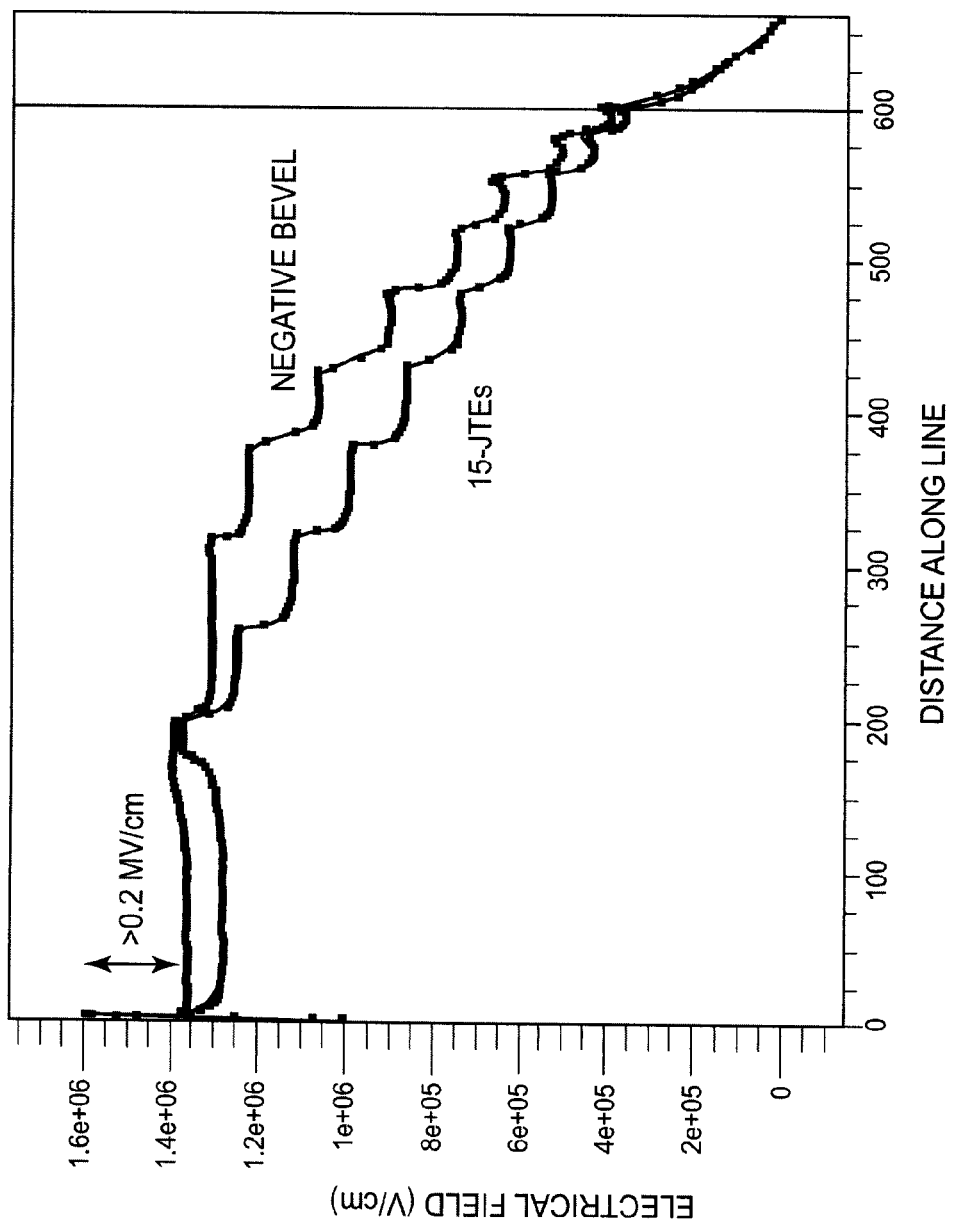
Figure 5:
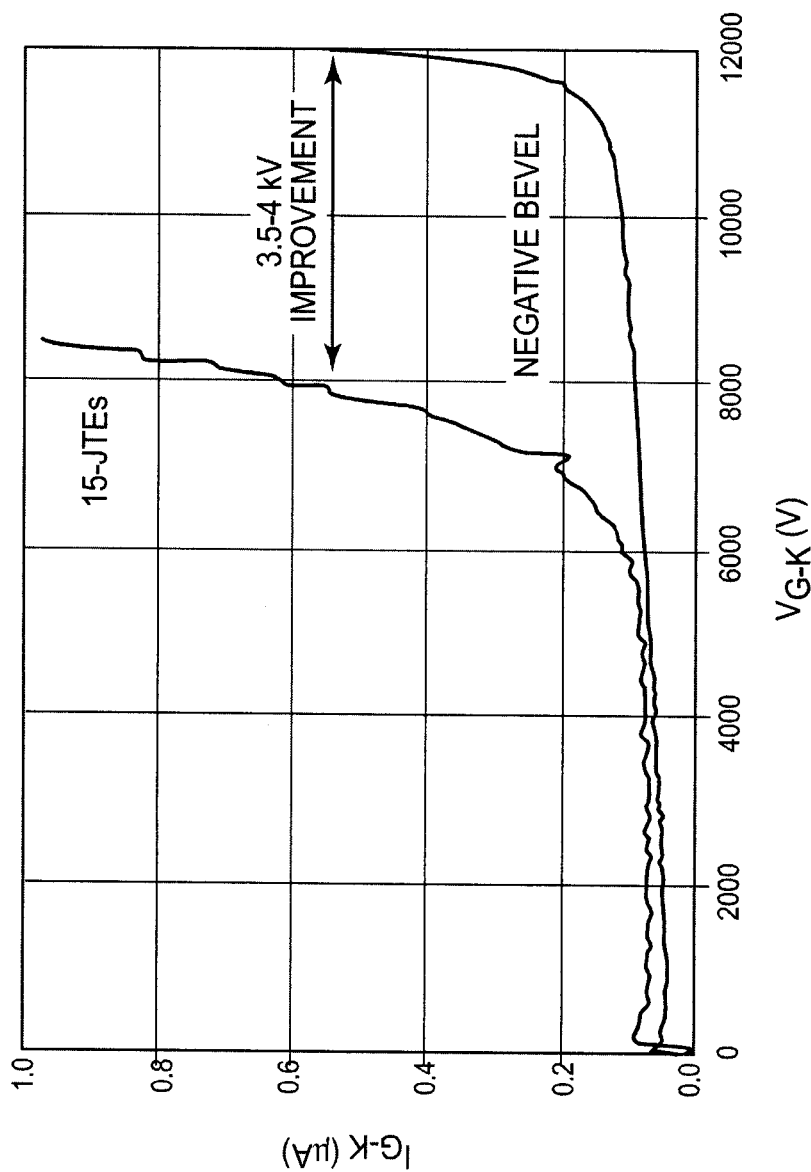
Figure 6:
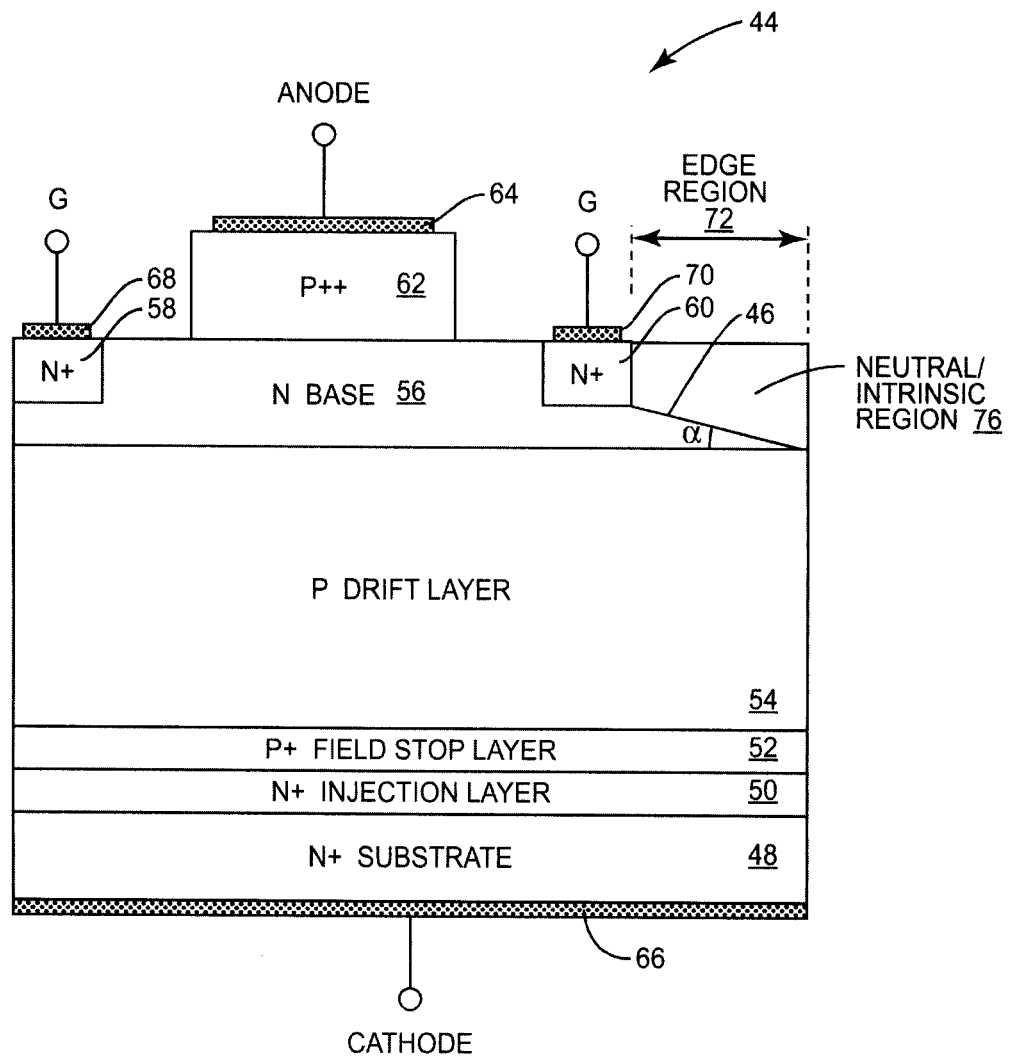
Figure 7:
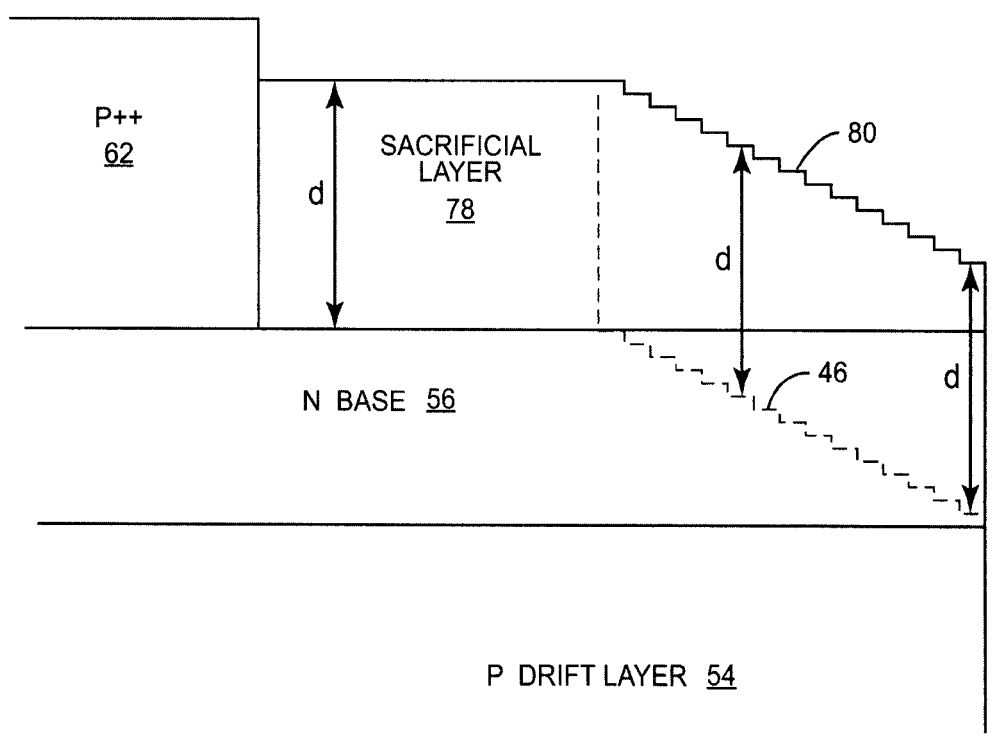
Figure 8:
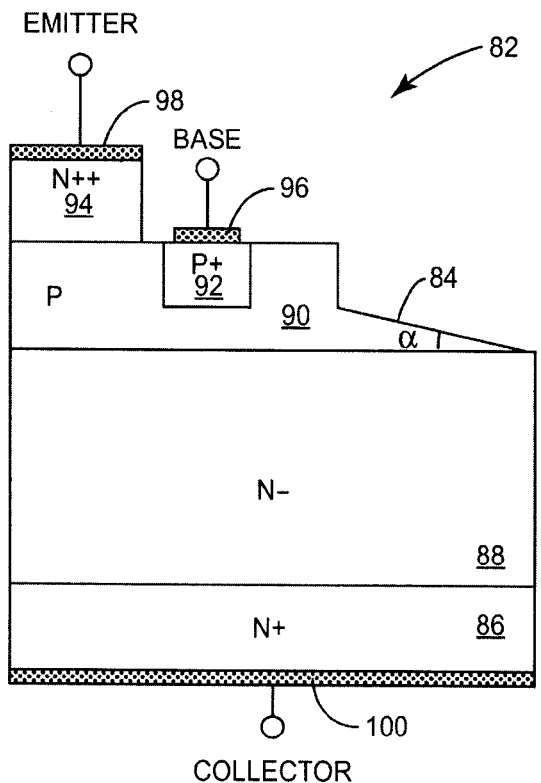
Figure 9:
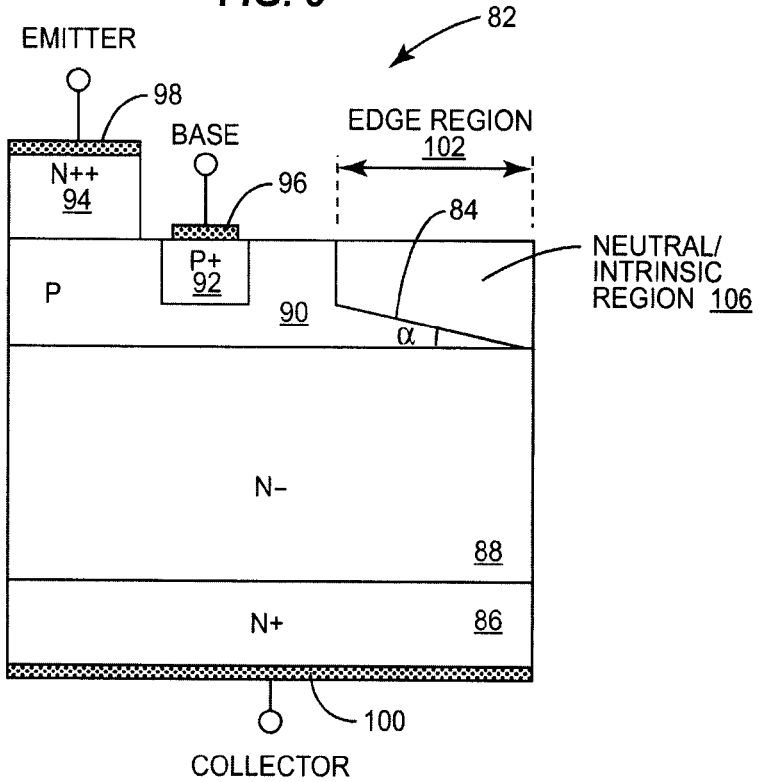
Figure 10:
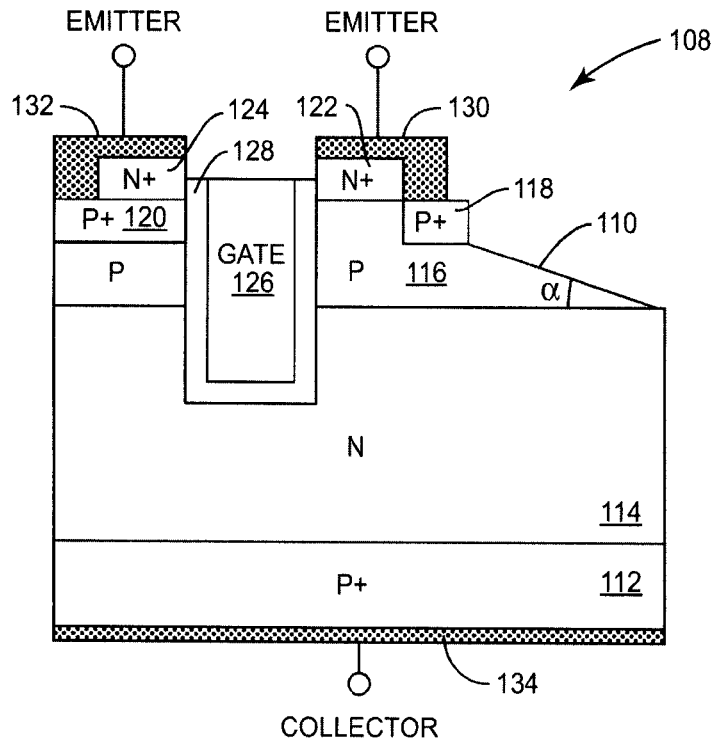
Figure 11:
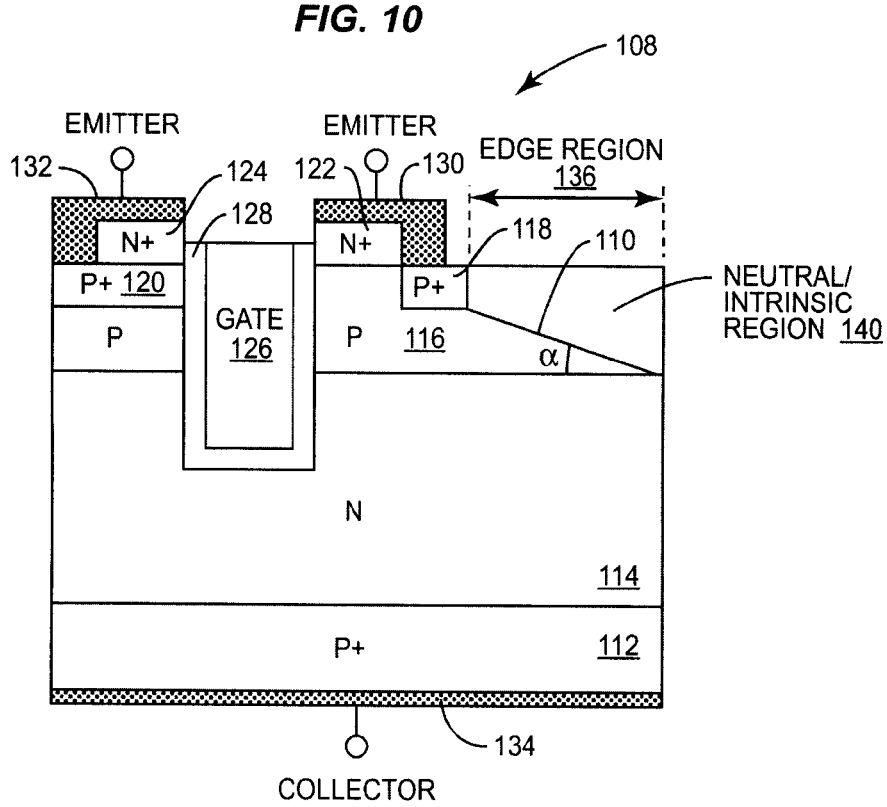
Figure 12:
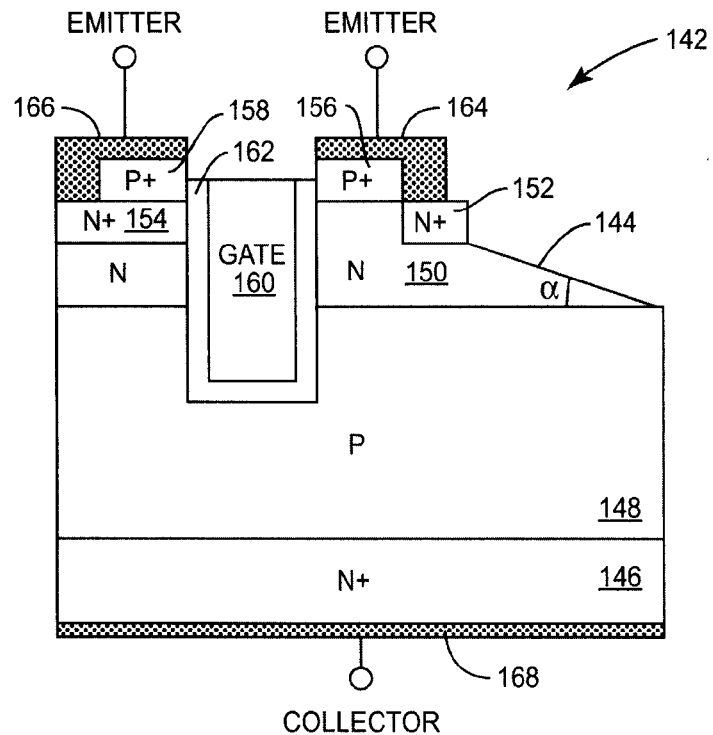
Figure 13:
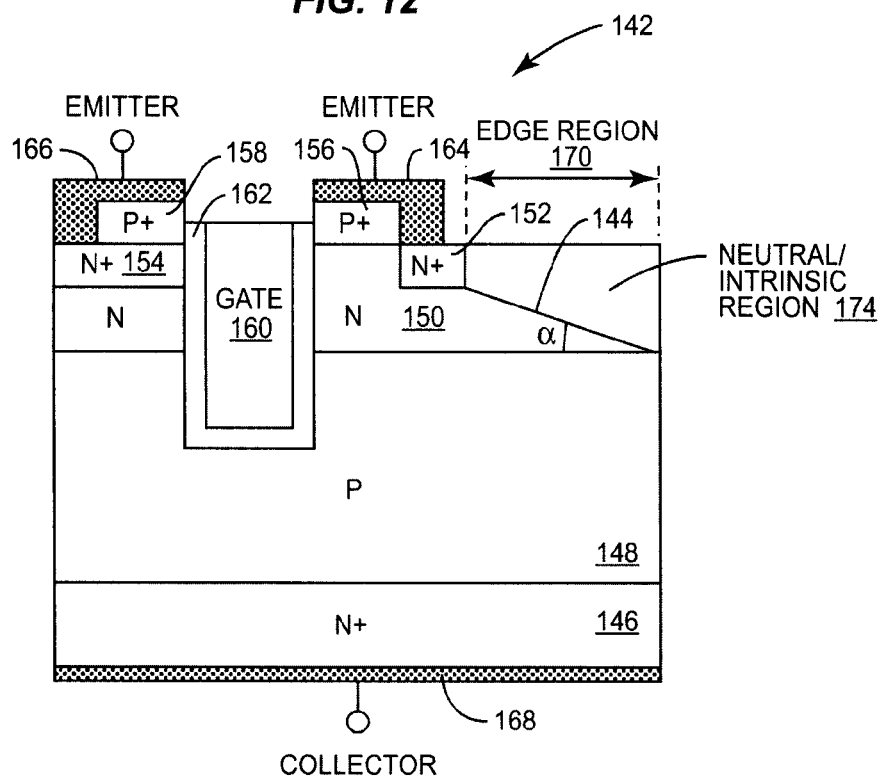
Figure 14:
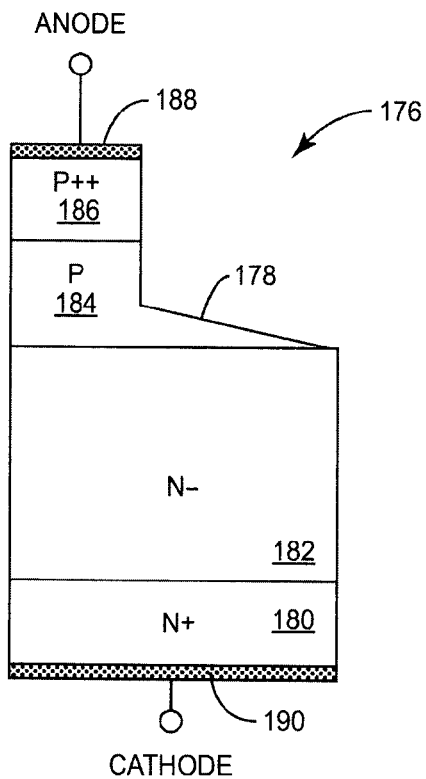
Figure 15:
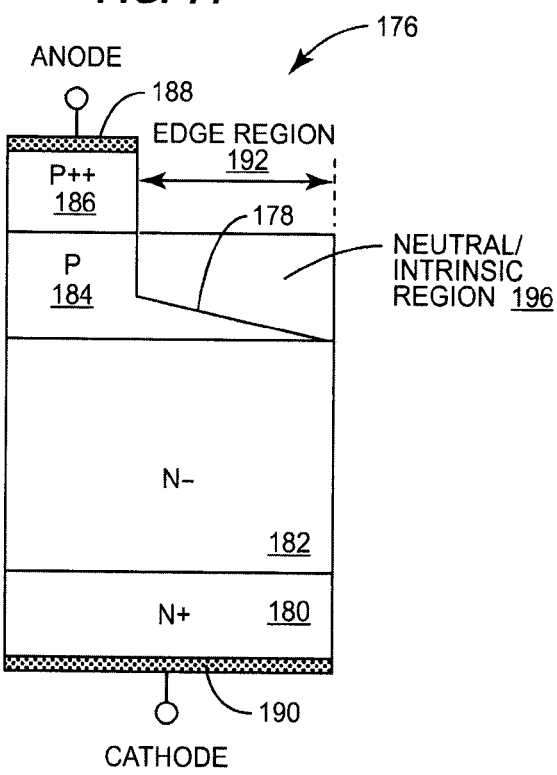
Figure 16:
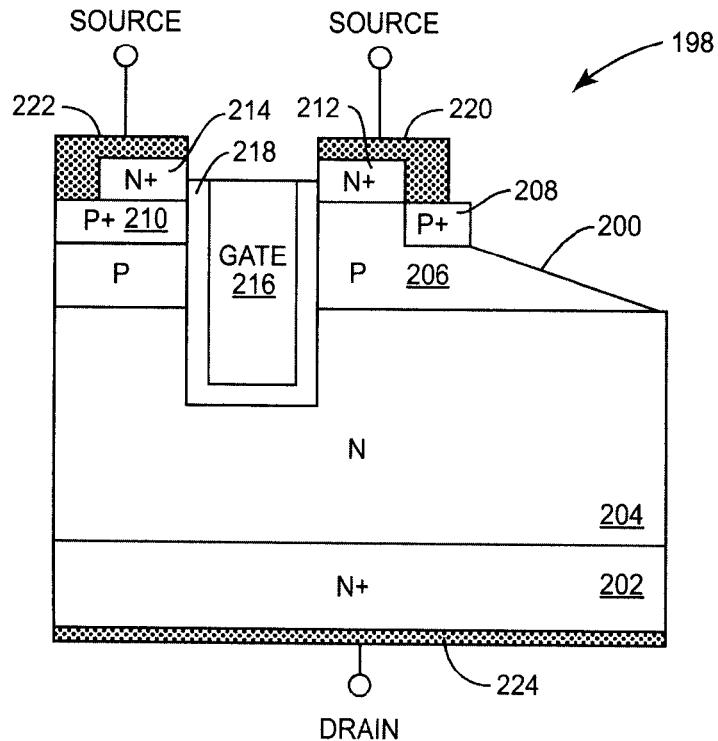
Figure 17:
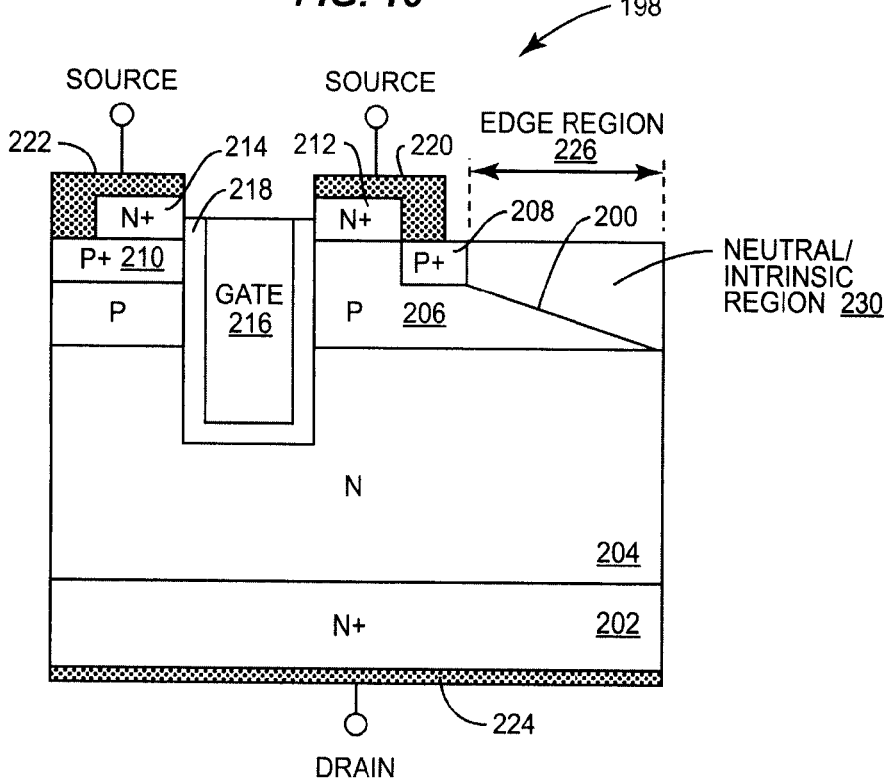

FIG. 4 graphically illustrates an electric field in the multi-step negative bevel edge termination of FIG. 3 as compared to that of a JTE termination according to one embodiment of the present disclosure;

FIG. 5 graphically illustrates a blocking voltage resulting from the multi-step negative bevel edge termination of FIG. 3 as compared to that of a JTE termination according to one embodiment of the present disclosure;

FIG. 6 illustrates a thyristor including a negative bevel edge termination formed by counter-doping the base layer according to another embodiment of the present disclosure;

FIG. 7 illustrates an embodiment where a multi-step negative bevel edge termination is provided by first forming a sacrificial layer on the base layer and then etching the sacrificial layer such that the desired multi-step characteristic is transferred to the base layer to thereby provide the multi-step negative bevel edge termination;

FIG. 8 illustrates a SiC Bipolar Junction Transistor (BJT) having a negative bevel edge termination like that illustrated in FIG. 3 according to one embodiment of the present disclosure;

FIG. 9 illustrates a SiC BJT having a negative bevel edge termination formed by counter-doping the base layer according to another embodiment of the present disclosure;

FIG. 10 illustrates a P-type SiC Insulated Gate Bipolar Transistor (IGBT) having a negative bevel edge termination like that illustrated in FIG. 3 according to one embodiment of the present disclosure;

FIG. 11 illustrates a P-type SiC IGBT having a negative bevel edge termination formed by counter-doping the base layer according to another embodiment of the present disclosure;

FIG. 12 illustrates an n-type SiC IGBT having a negative bevel edge termination like that illustrated in FIG. 3 according to one embodiment of the present disclosure;

FIG. 13 illustrates an n-type SiC IGBT having a negative bevel edge termination formed by counter-doping the base layer according to another embodiment of the present disclosure;

FIG. 14 illustrates a SiC PIN diode having a negative bevel edge termination like that illustrated in FIG. 3 according to one embodiment of the present disclosure;

FIG. 15 illustrates a SiC PIN diode having a negative bevel edge termination formed by counter-doping one of the semiconductor layers according to another embodiment of the present disclosure;

FIG. 16 illustrates a SiC U-channel Metal-Oxide-Semiconductor Field Effect Transistor (UMOSFET) having a negative bevel edge termination like that illustrated in FIG. 3 according to another embodiment of the present disclosure; and FIG. 17 illustrates a SiC UMOSFET having a negative bevel edge termination formed by counter-doping the base layer according to another embodiment of the present disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 2:
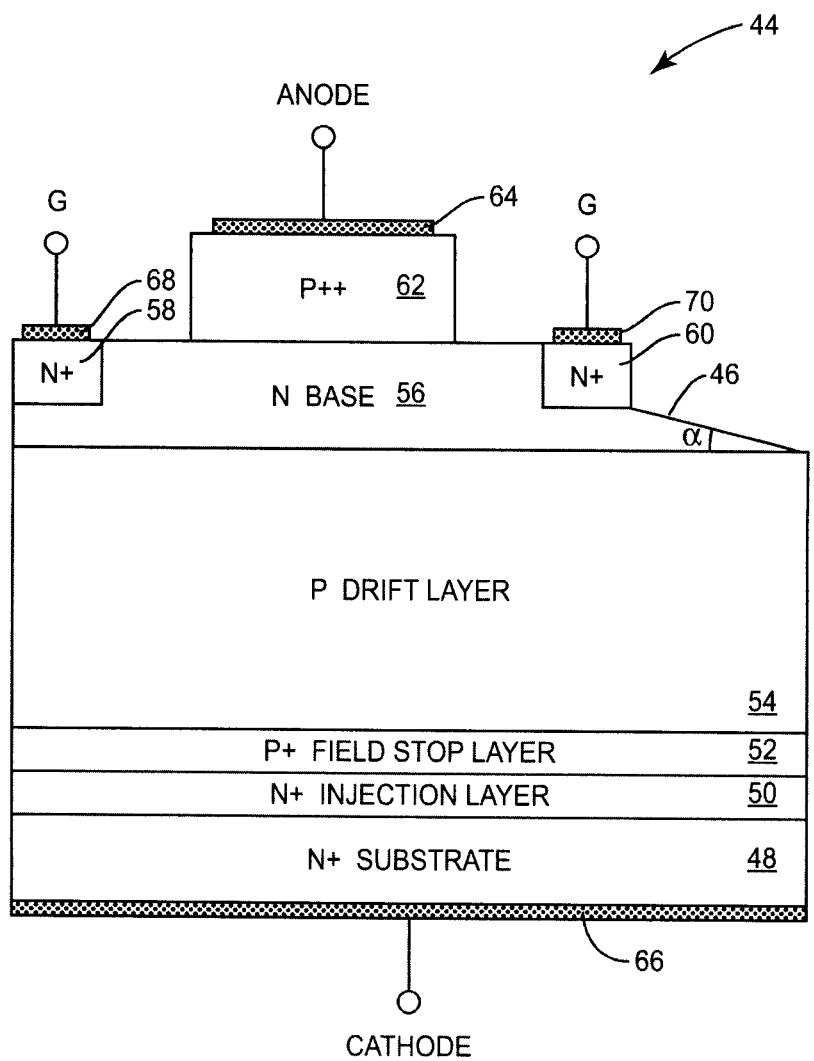
FIG. 2 illustrates a SiC thyristor including a negative bevel edge termination according to one embodiment of the present disclosure.

FIG. 2 illustrates a Silicon Carbide (SiC) thyristor 44 having a negative bevel edge termination 46 according to one embodiment of the present disclosure. Before proceeding, it should be noted that while the discussion herein focuses on SiC semiconductor devices, the concepts disclosed herein are equally applicable to semiconductor devices fabricated using other types of semiconductor materials (e.g., Silicon). As illustrated, the thyristor 44 includes a substrate 48, an injection layer 50 on a surface of the substrate 48, a field stop layer 52 on a surface of the injection layer 50 opposite the substrate 48, a drift layer 54 on a surface of the field stop layer 52 opposite the injection layer 50, and a base layer 56 on a surface of the drift layer 54 opposite the field stop layer 52. Gate regions 58 and 60 are formed in a surface of the base layer 56 opposite the drift layer 54 and are separated by a desired lateral distance. An anode mesa, or region, 62 is on the surface of the base layer 56 between the gate regions 58 and 60. An anode contact 64 is on a surface of the anode mesa 62 opposite the base layer 56, a cathode contact 66 is on a surface of the substrate 48 opposite the injection layer 50, and gate contacts 68 and 70 are on the surface of the base layer 56 over the gate regions 58 and 60, respectively. Notably, in one exemplary embodiment, the thyristor 44 is fabricated on a semiconductor die having an area greater than or equal to 1 cm$^2$.

The substrate 48 is preferably a SiC substrate, and the injection layer 50, the field stop layer 52, the drift layer 54, the base layer 56, and the anode mesa 62 are preferably all epitaxial layers of SiC grown on the substrate 48. The gate regions 58 and 60 are preferably formed by injecting ions into the base layer 56 via, for example, ion implantation. In this particular embodiment, the substrate 48 is highly doped N-type (N+), the injection layer 50 is highly doped N-type (N+), the field stop layer 52 is highly doped P-type (P+), the drift layer 54 is doped P-type (P), the base layer 56 is doped N-type (N), the gate regions 58 and 60 are highly doped N-type (N+), and the anode mesa 62 is very highly doped P-type (P++). In one embodiment, the substrate 48 has doping level in a range of and including $1\times10^{18}$ to $1\times10^{19}$ cm$^{-3}$ and a thickness in a range of and including about 100 to 350 microns (μm), the injection layer 50 has a doping level greater than or equal to $1\times10^{18}$ cm$^{-3}$ and a thickness in a range of and including 1 to 5 μm, the field stop layer 52 has a doping level in a range of and including $1\times10^{18}$ to $5\times10^{17}$ cm$^{-3}$ and a thickness in a range of and including 1 to 5 µm, the drift layer 54 has a doping level less than $2\times10^{14}$ cm$^{-3}$ and a thickness that is greater than or equal to 80 µm, the base layer 56 has a doping level in a range of and including $1\times10^{16}$ to $1\times10^{18}$ cm$^{-3}$ and a thickness in a range of and including 0.5 to 5 µm, and the anode mesa 62 has a doping level that is greater than $1\times10^{19}$ cm$^{-3}$ and a thickness in a range of and including 0.5 to 5 µm. In one particular embodiment, the substrate 48 has doping level in a range of and including $1\times10^{18}$ to $1\times10^{19}$ cm$^{-3}$ and a thickness in a range of and including about 100 to 350 µm, the injection layer 50 has a doping level of $5\times10^{18}$ cm$^{-3}$ and a thickness of 1 µm, the field stop layer 52 has a doping level of $1\times10^{16}$ cm$^{-3}$ and a thickness of 4 µm, the drift layer 54 has a doping level less than $2\times10^{14}$ cm$^{-3}$ and a thickness of 90 µm, the base layer 56 has a doping level of $1\times10^{17}$ cm$^{-3}$ and a thickness of 2.5 µm, and the anode mesa 62 has a doping level that is greater than $2\times10^{19}$ cm$^{-3}$ and a thickness in a range of and including 0.5 to 5 µm. The gate regions 58 and 60 are N+ regions that, in one embodiment, have a doping level greater than $1\times10^{18}$ cm$^{-3}$. Lastly, the contacts 64, 66, 68, and 70 are formed of any suitable contact material (e.g., metal, metal alloy, etc.).

An edge of the thyristor 44 is terminated by the negative bevel edge termination 46. In one embodiment, a width of the negative bevel edge termination 46 is 600 µm. In the preferred embodiment, a slope angle (α) of the negative bevel edge termination 46 is less than or equal to 15 degrees. As discussed below in more detail, the negative bevel edge termination 46 is implemented as a multi-step negative bevel edge termination that approximates a smooth slope. Notably, a negative bevel having a smooth slope is not obtainable in SiC. For example, wet etching can be used to form a negative bevel edge termination having a smooth slope for Silicon devices, but wet etching is not suitable for SiC and therefore cannot be used to form a negative bevel edge termination having a smooth slope for SiC devices. Therefore, as discussed herein, the negative bevel edge termination 46 is implemented as a multi-step negative bevel edge termination that approximates a smooth slope.

In one embodiment, the multi-step negative bevel edge termination 46 includes a number of steps that approximate a smooth slope at the desired slope angle (α). In one embodiment, the multi-step negative bevel edge termination 46 includes at least 10 steps that approximate a smooth slope at the desired slope angle (α). In another embodiment, the multi-step negative bevel edge termination 46 includes at least 15 steps that approximate a smooth slope at the desired slope angle (α). As a result of the negative bevel edge termination 46, a blocking voltage of the thyristor 44 approaches a blocking voltage of an ideal parallel-plane device. In this particular embodiment, the blocking voltage is greater than or equal to 12 kilovolts (kV). As used herein, the blocking voltage of a device is a voltage at which the device conducts a 1 microamp (µA) current. In the case of the thyristor 44, the blocking voltage is a voltage that, when applied from the anode contact 64 to the cathode contact 66, will cause a 1 µA current to flow through the thyristor 44 when no voltage is applied to the gate contacts 68 and 70.

FIG. 3 illustrates the negative bevel edge termination 46 of FIG. 2 in more detail according to one embodiment of the present disclosure. As shown, the negative bevel edge termination 46 is more specifically a multi-step negative bevel edge termination 46. In this particular embodiment, the multi-step negative bevel edge termination 46 includes 15 steps that approximate the desired slope angle (α). The multi-step negative bevel edge termination 46 relieves field crowding, thereby improving the blocking voltage. As discussed below, in one embodiment, the blocking voltage is improved to at least 12 kV. The multi-step negative bevel edge termination 46 of this embodiment is formed by etching the base layer 56 using a suitable number of masks. In one embodiment, the number of masks is equal to the number of steps (e.g., 15 masks to form 15 steps). In another embodiment, the number of masks may be optimized to reduce the number of etching steps such that the total number of masks is less than the number of steps in the multi-step negative bevel edge termination 46 (e.g., 4-15 masks for 15 steps).

Figure 1:
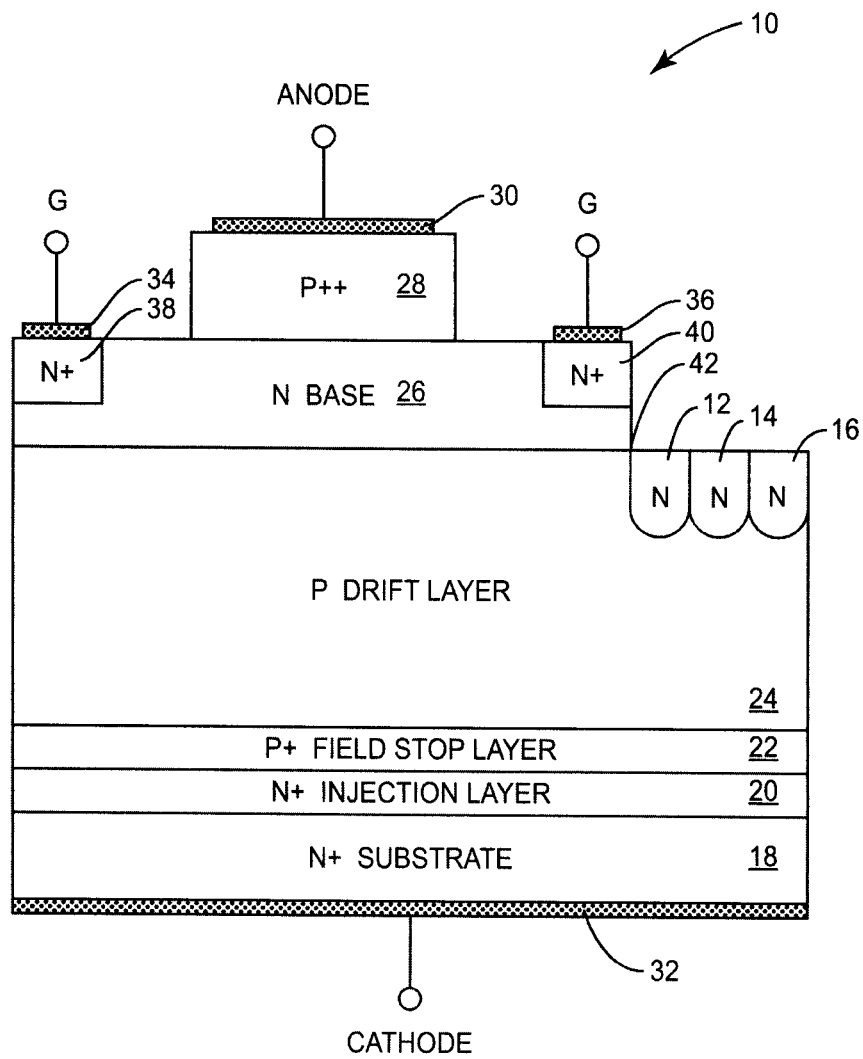
FIG. 1 illustrates a Silicon Carbide (SiC) thyristor including a conventional Junction Termination Extension (JTE) edge termination.

FIG. 4 graphically compares the electric field distribution along the multi-step negative bevel edge termination 46 of FIG. 3 with that of a 15 well Junction Termination Extension (JTE) edge termination at 12 kV according to one embodiment of the present disclosure. As shown, the multi-step negative bevel edge termination 46 has effectively reduced the peak electric field found at the mesa trench corner (e.g., the corner 42 of the thyristor 10 of FIG. 1) to less than 1.4 Mega-Volts per centimeter (MV/cm). In other words, the peak electric field found at the junction edge is reduced by more than 0.2 MV/cm.

FIG. 5 graphically compares the blocking voltage of the thyristor 44 including the multi-step negative bevel edge termination 46 of FIG. 3 with that of a thyristor (e.g., the thyristor 10 of FIG. 1) having a 15 well JTE edge termination according to one embodiment of the present disclosure. As illustrated, as a result of the multi-step negative bevel edge termination 46, the thyristor 44 has a blocking voltage in a range of 11.5 to 12 kV. This is a 3.5 to 4 kV improvement over the 9 kV blocking voltage resulting from the 15 well JTE edge termination.

FIG. 6 illustrates the thyristor 44 including the negative bevel edge termination 46 according to another embodiment of the present disclosure. In this embodiment, rather than etching the base layer 56 to form the multi-step negative bevel edge termination 46 as discussed above with respect to FIG. 3, the negative bevel edge termination 46 is formed by counter-doping the base layer 56 in an edge region 72 adjacent to the gate region 60 opposite the anode mesa 62 with a P-type ion that compensates the n-type conductivity of the base layer 56 in the edge region 72 to provide a neutral, or intrinsic, region 76 having a desired negative bevel edge characteristic. The P-type ion may be, for example, Aluminum (Al), Boron (B), or the like. The negative bevel edge termination 46 is thereby formed at an interface of the neutral region 76 and a remainder of the base layer 56. More specifically, in one embodiment, ions are implanted to varying depths that increase step-wise starting at the end of the edge region 72 adjacent to the gate region 60 and proceeding outwardly to provide the desired number of steps and slope (α) for the negative bevel edge termination 46.

FIG. 7 illustrates another process by which the negative bevel edge termination 46 can be formed. In this embodiment, a sacrificial layer 78 is formed on the surface of the base layer 56 over an area where the negative bevel edge termination 46 is to be formed. The sacrificial layer 78 may be, for example, SiO$_2$, photo-resist, or similar material. The sacrificial layer 78 is etched or otherwise processed to provide a negative bevel 80 having a desired multi-step characteristic (i.e., number of steps, slope angle, width, etc.) for the negative bevel edge termination 46. An etching process is then performed to remove the specifically, an etching process is performed to etch to a desired depth (d), which in this example is equal to the thickness of the sacrificial layer 78 and also equal to the thickness of the base layer 56. However, the present disclosure is not limited thereto. As a result of the etching, the negative bevel 80 is effectively transferred to the base layer 56 to thereby provide the multi-step negative bevel edge termination 46.

FIGS. 8 through 17 illustrate additional, non-limiting, examples of other types of SiC devices that can utilize the negative bevel edge termination described above with respect to the thyristor 44. More specifically, FIG. 8 illustrates a SiC Bipolar Junction Transistor (BJT) 82 including a negative bevel edge termination 84 according to one embodiment of the present disclosure. The BJT 82 includes an N+ substrate 86, an N-type drift layer 88 on a surface of the substrate 86, a P-type base layer 90 on a surface of the drift layer 88 opposite the substrate 86, a P+ base region 92 formed in the base layer 90, an N++ emitter mesa 94 on the surface of the base layer 90 opposite the drift layer 88, a base contact 96 on the base region 92, an emitter contact 98 on the emitter mesa 94, and a collector contact 100 on a surface of the substrate 86 opposite the drift layer 88. In this embodiment, the negative bevel edge termination 84 is a multi-step negative bevel edge termination like that of FIG. 3. As a result of the negative bevel edge termination 84, a blocking voltage of the BJT 82 approaches the blocking voltage of the ideal parallel-plane device.

FIG. 9 illustrates the BJT 82 including the negative bevel edge termination 84 according to another embodiment of the present disclosure. In this embodiment, the negative bevel edge termination 84 is formed by counter-doping the P-type base layer 90 in an edge region 102 adjacent to the P+ base region 92 opposite the emitter mesa 94 with an N-type ion that compensates the P-type conductivity of the base layer 90 in the edge region 102 to provide a neutral, or intrinsic, region 106 having a desired negative bevel characteristic. The N-type ion may be, for example, Nitrogen (N), Phosphorous (P), or the like. The negative bevel edge termination 84 is thereby formed at an interface of the neutral region 106 and a remainder of the base layer 90. More specifically, in one embodiment, ions are implanted to varying depths that increase step-wise starting at the end of the edge region 102 adjacent to the P+ base region 92 and proceeding outwardly to provide the desired number of steps and slope ($\alpha$) for the negative bevel edge termination 84.

FIG. 10 illustrates a P-type SiC Insulated Gate Bipolar Transistor (IGBT) 108 including a negative bevel edge termination 110 according to one embodiment of the present disclosure. As illustrated, the IGBT 108 includes a P+ substrate or epilayer 112, an N-type drift layer 114 on a surface of the substrate 112, a base layer 116 on a surface of the drift layer 114 opposite the substrate 112, P+ regions 118 and 120 on the surface of the base layer 116 opposite the drift layer 114, and emitter regions 122 and 124. A gate contact 126 is formed in a trench as shown and is insulated by a gate insulator 128. Emitter contacts 130 and 132 are on the emitter regions 122 and 124, respectively, and a collector contact 134 is on a surface of the substrate 112 opposite the drift layer 114. In this embodiment, the negative bevel edge termination 110 is a multi-step negative bevel edge termination like that of FIG. 3. As a result of the negative bevel edge termination 110, a blocking voltage of the IGBT 108 approaches the blocking voltage of the ideal parallel-plane device.

FIG. 11 illustrates the IGBT 108 including the negative bevel edge termination 110 according to another embodiment of the present disclosure. In this embodiment, the negative bevel edge termination 110 is formed by counter-doping the P-type base layer 116 in an edge region 136 adjacent to the P+ region 118 and the N+ emitter region 122 opposite the gate contact 126 with an N-type ion that compensates the P-type conductivity of the base layer 116 in the edge region 136 to provide a neutral, or intrinsic, region 140 having a desired negative bevel characteristic. The N-type ion may be, for example, Nitrogen (N), Phosphorous (P), or the like. The negative bevel edge termination 110 is thereby formed at an interface of the neutral region 140 and a remainder of the base layer 116. More specifically, in one embodiment, ions are implanted to varying depths that increase step-wise starting at the end of the edge region 136 adjacent to the P+ region 118 and proceeding outwardly to provide the desired number of steps and slope ($\alpha$) for the negative bevel edge termination 110.

FIG. 12 illustrates an n-type SiC IGBT 142 including a negative bevel edge termination 144 according to one embodiment of the present disclosure. As illustrated, the IGBT 142 includes a substrate 146, a drift layer 148 on a surface of the substrate 146, a base layer 150 on a surface of the drift layer 148 opposite the substrate 146, N+ regions 152 and 154 on the surface of the base layer 150 opposite the drift layer 148, and emitter regions 156 and 158. A gate contact 160 is formed in a trench as shown and is insulated by a gate insulator 162. Emitter contacts 164 and 166 are on the emitter regions 156 and 158, respectively, and a collector contact 168 is on a surface of the substrate 146 opposite the drift layer 148. In this embodiment, the negative bevel edge termination 144 is a multi-step negative bevel edge termination like that of FIG. 3. As a result of the negative bevel edge termination 144, a blocking voltage of the IGBT 142 approaches the blocking voltage of the ideal parallel-plane device.

FIG. 13 illustrates the IGBT 142 including the negative bevel edge termination 144 according to another embodiment of the present disclosure. In this embodiment, the negative bevel edge termination 144 is formed by counter-doping the N-type base layer 150 in an edge region 170 adjacent to the N+ region 152 and the P+ emitter region 156 opposite the gate contact 160 with a P-type ion that compensates the N-type conductivity of the base layer 150 in the edge region 170 to provide a neutral, or intrinsic, region 174 having a desired negative bevel characteristic. The P-type ion may be, for example, Aluminum (Al), Boron (B), or the like. The negative bevel edge termination 144 is thereby formed at an interface of the neutral region 174 and a remainder of the base layer 150. More specifically, in one embodiment, ions are implanted to varying depths that increase step-wise starting at the end of the edge region 170 adjacent to the N+ region 152 and the P+ emitter region 156 and proceeding outwardly to provide the desired number of steps and slope ($\alpha$) for the negative bevel edge termination 144.

FIG. 14 illustrates a SiC PIN diode 176 including a negative bevel edge termination 178 according to one embodiment of the present disclosure. As illustrated, the PIN diode 176 includes an N+ substrate 180, a N− drift layer 182, a P-type layer 184, and P++ layer 186 arranged as shown. The N− drift layer 182 may also be referred to herein as an intrinsic layer between the N+ substrate 180 and the P-type layer 184 forming the PIN diode 176. The P++ layer 186 may also be referred to herein as an anode mesa. An anode contact 188 is on the surface of the P++ layer 186 opposite the P-type layer 184. A cathode contact 190 is on a surface of the N+ substrate 180 opposite the N− drift layer 182. In this embodiment, the negative bevel edge termination 178 is a multi-step negative bevel edge termination like that of FIG. 3. As a result of the negative bevel edge termination 178, a blocking voltage, which is more specifically a reverse breakdown voltage of the PIN diode 176, approaches the blocking voltage of the ideal parallel-plane device.

FIG. 15 illustrates the PIN diode 176 including the negative bevel edge termination 178 according to another embodiment of the present disclosure. In this embodiment, the negative bevel edge termination 178 is formed by counter-doping the P-type layer 184 in an edge region 192 adjacent to the P++ layer 186 with an N-type ion that compensates the P-type conductivity of the P-type layer 184 in the edge region 192 to provide a neutral, or intrinsic, region 196 having a desired negative bevel characteristic. The N-type ion may be, for example, Nitrogen (N), Phosphorous (P), or the like. The negative bevel edge termination 178 is thereby formed at an interface of the neutral region 196 and a remainder of the P-type layer 184. More specifically, in one embodiment, ions are implanted to varying depths that increase step-wise starting at the end of the edge region 192 adjacent to the P++ layer 186 and proceeding outwardly to provide the desired number of steps and slope ($\alpha$) for the negative bevel edge termination 178.

FIG. 16 illustrates a SiC U-channel Metal-Oxide-Semiconductor Field Effect Transistor (UMOSFET) 198 including a negative bevel edge termination 200 according to one embodiment of the present disclosure. As illustrated, the UMOSFET 198 includes an N+ substrate 202, an N-type drift layer 204 on a surface of the substrate 202, a P-type base layer 206 on a surface of the drift layer 204 opposite the substrate 202, P+ regions 208 and 210 on the surface of the base layer 206 opposite the drift layer 204, and N+ source regions 212 and 214. A gate contact 216 is formed in a trench as shown and is insulated by a gate insulator 218. Source contacts 220 and 222 are on the source regions 212 and 214, respectively, and a drain contact 224 is on a surface of the substrate 202 opposite the drift layer 204. In this embodiment, the negative bevel edge termination 200 is a multi-step negative bevel edge termination like that of FIG. 3. As a result of the negative bevel edge termination 200, a blocking voltage of the UMOSFET 198 approaches the blocking voltage of the ideal parallel-plane device.

FIG. 17 illustrates the UMOSFET 198 including the negative bevel edge termination 200 according to another embodiment of the present disclosure. In this embodiment, the negative bevel edge termination 200 is formed by counter-doping the P-type base layer 206 in an edge region 226 adjacent to the P+ region 208 and the N+ source region 212 opposite the gate contact 216 with an N-type ion that compensates the P-type conductivity of the base layer 206 in the edge region 226 to provide a neutral, or intrinsic, region 230 having a desired negative bevel characteristic. The N-type ion may be, for example, Nitrogen (N), Phosphorous (P), or the like. The negative bevel edge termination 200 is thereby formed at an interface of the neutral region 230 and a remainder of the base layer 206. More specifically, in one embodiment, ions are implanted to varying depths that increase step-wise starting at the end of the edge region 226 adjacent to the P+ region 208 and the N+ source region 212 and proceeding outwardly to provide the desired number of steps and slope ($\alpha$) for the negative bevel edge termination 200.

Finally, it should be noted that the number of steps in the multi-step negative bevel edge termination 46, 84, 110, 144, 178, and 200 of the various devices described herein may vary depending on the particular implementation. Some exemplary embodiments of the multi-step negative bevel edge termination 46, 84, 110, 144, 178, and 200 include at least 5 steps, at least 7 steps, at least 10 steps, at least 12 steps, at least 15 steps, at least 17 steps, at least 20 steps, a number of steps in a range of and including 5 to 20 steps, a number of steps in a range of and including 10 to 20 steps, a number of steps in a range of and including 15 to 20 steps, and a number of steps in a range of and including 10 to 15 steps. Also, the blocking voltages of the various devices may also vary depending on the particular implementation. Some exemplary embodiments include a blocking voltage of at least 10 kV, a blocking voltage of at least 12 kV, a blocking voltage of at least 15 kV, a blocking voltage of at least 17 kV, a blocking voltage of at least 20 kV, a blocking voltage of at least 22 kV, a blocking voltage of at least 25 kV, a blocking voltage in a range of and including 10 kV to 25 kV, a blocking voltage in a range of and including 12 kV to 25 kV, a blocking voltage in a range of and including 15 kV to 25 kV, a blocking voltage in a range of and including 12 kV to 20 kV, and a blocking voltage in a range of and including 12 kV to 15 kV.

Those skilled in the art will recognize improvements and modifications to the preferred embodiments of the present disclosure. All such improvements and modifications are considered within the scope of the concepts disclosed herein and the claims that follow.

What is claimed is:

1. A Silicon Carbide (SiC) semiconductor device comprising:
a multi-step negative bevel edge termination that approximates a smooth slope;
a semiconductor layer of a first conductivity type;
wherein a surface of the semiconductor layer in an edge region of the semiconductor layer is doped with ions of a second conductivity type to thereby provide a neutral region in the semiconductor layer having a desired negative bevel characteristic.

2. The SiC semiconductor device of claim 1 wherein the multi-step negative bevel edge termination includes at least five steps.

3. The SiC semiconductor device of claim 1 wherein the multi-step negative bevel edge termination includes at least ten steps.

4. The SiC semiconductor device of claim 1 wherein the multi-step negative bevel edge termination includes at least fifteen steps.

5. The SiC semiconductor device of claim 1 wherein a blocking voltage of the SiC semiconductor device is at least 10 kilovolts (kV).

6. The SiC semiconductor device of claim 1 wherein a blocking voltage of the SiC semiconductor device is at least 12 kilovolts (kV).

7. The SiC semiconductor device of claim 6 wherein a die area of the SiC semiconductor device is greater than or equal to 1 cm$^2$.

8. The SiC semiconductor device of claim 1 wherein a blocking voltage of the SiC semiconductor device is in a range of and including 10 to 25 kilovolts (kV).

9. The SiC semiconductor device of claim 1 wherein a blocking voltage of the SiC semiconductor device is in a range of and including 12 to 25 kilovolts (kV).

10. The SiC semiconductor device of claim 1 wherein a slope angle of the multi-step negative bevel edge termination is less than or equal to 15 degrees.

11. The SiC semiconductor device of claim 1 wherein the multi-step negative bevel edge termination comprises a plurality of steps formed on a surface of a corresponding layer of the SiC semiconductor device.

12. The SiC semiconductor device of claim 1 wherein an interface between the neutral region and a remainder of the semiconductor layer provides the multi-step negative bevel edge termination.

13. A Silicon Carbide (SiC) semiconductor device comprising a multi-step negative bevel edge termination that approximates a smooth slope, wherein the SiC semiconductor device is a thyristor that includes:
a substrate of a first conductivity type;

a drift layer of a second conductivity type on a surface of the substrate;
a base layer of the first conductivity type on a surface of the drift layer opposite the substrate;
an anode mesa of the second conductivity type on a surface of the base layer opposite the drift layer;
a gate region formed in the surface of the base layer;
wherein the multi-step negative bevel edge termination is formed in the base layer adjacent to the gate region opposite the anode mesa.

14. The SiC semiconductor device of claim 13 wherein the multi-step negative bevel edge termination is formed on the surface of the base layer adjacent to the gate region opposite the anode mesa.

15. The SiC semiconductor device of claim 13 wherein a surface of the base layer in an edge region adjacent to the gate region opposite the anode mesa is counter-doped with ions of the second conductivity type to thereby provide a neutral region in the base layer having a desired negative bevel characteristic such that an interface between the neutral region and a remainder of the base layer provides the multi-step negative bevel edge termination.

16. A Silicon Carbide (SiC) semiconductor device comprising a multi-step negative bevel edge termination that approximates a smooth slope, wherein the SiC semiconductor device is a Bipolar Junction Transistor (BJT) that includes:
a substrate of a first conductivity type;
a drift layer of a second conductivity type on a surface of the substrate;
a base layer of the first conductivity type on a surface of the drift layer opposite the substrate;
an emitter region of the second conductivity type on a surface of the base layer opposite the drift layer; and
a gate trench formed in a surface of the BJT adjacent to the emitter region and extending into the drift layer;
wherein the multi-step negative bevel edge termination is formed in the base layer adjacent to the emitter region opposite the gate trench.

17. A Silicon Carbide (SiC) semiconductor device comprising a multi-step negative bevel edge termination that approximates a smooth slope, wherein the SiC semiconductor device is a U-channel Metal-Oxide-Semiconductor Field Effect Transistor (UMOSFET) that includes:
a substrate of a first conductivity type;
a drift layer of the first conductivity type on a surface of the substrate;
a base layer of a second conductivity type on a surface of the drift layer opposite the substrate;
a source region of the first conductivity type on a surface of the base layer opposite the drift layer; and
a gate trench formed in a surface of the UMOSFET adjacent to the source region and extending into the drift layer;
wherein the multi-step negative bevel edge termination is formed in the base layer adjacent to the source region opposite the gate trench.

18. A Silicon Carbide (SiC) semiconductor device comprising a multi-step negative bevel edge termination that approximates a smooth slope, wherein the SiC semiconductor device is a PIN diode that includes:
a substrate of a first conductivity type;
a drift layer of the first conductivity type on a surface of the substrate;
a semiconductor layer of a second conductivity type on a surface of the drift layer opposite the substrate;
an anode mesa on a surface of the semiconductor layer of the second conductivity type opposite the drift layer;
an anode contact on a surface of the anode mesa opposite the drift layer; and
a cathode contact on a surface of the substrate opposite the drift layer;
wherein the multi-step negative bevel edge termination is formed in the semiconductor layer of the second conductivity type adjacent to the anode mesa.

19. A Silicon Carbide (SiC) semiconductor device having a blocking voltage of at least 10 kilovolts (kV), the SiC semiconductor device comprising:
a semiconductor layer of a first conductivity type;
wherein a surface of the semiconductor layer in an edge region of the semiconductor layer is counter-doped with ions of a second conductivity type to thereby provide a neutral region in the semiconductor layer having a desired negative bevel characteristic.

20. The SiC semiconductor device of claim 19 wherein the blocking voltage is at least 12 kV.

21. The SiC semiconductor device of claim 19 further comprising a multi-step negative bevel edge termination that includes at least 5 steps.

22. The SiC semiconductor device of claim 21 wherein the multi-step negative bevel edge termination includes at least 10 steps.

23. The SiC semiconductor device of claim 21 wherein the multi-step negative bevel edge termination includes at least 15 steps.

24. The SiC semiconductor device of claim 21 wherein the multi-step negative bevel edge termination includes a number of steps in a range of and including 10 to 25 steps.

25. A Silicon Carbide (SiC) semiconductor device having a blocking voltage of at least 10 kilovolts (kV), wherein the SiC semiconductor device is a thyristor comprising:
a substrate of a first conductivity type;
a drift layer of a second conductivity type on a surface of the substrate;
a base layer of the first conductivity type on a surface of the drift layer opposite the substrate;
an anode mesa of the second conductivity type on a surface of the base layer opposite the drift layer;
a gate region formed in the surface of the base layer;
wherein a multi-step negative bevel edge termination is formed in the base layer adjacent to the gate region opposite the anode mesa.

26. A Silicon Carbide (SiC) semiconductor device having a blocking voltage of at least 10 kilovolts (kV), wherein the SiC semiconductor device is a Bipolar Junction Transistor (BJT) comprising:
a substrate of a first conductivity type;
a drift layer of the first conductivity type on a surface of the substrate;
a base layer of a second conductivity type on a surface of the drift layer opposite the substrate;
a base region of the second conductivity type formed in a surface of the base layer opposite the drift layer; and
an emitter mesa on the surface of the base layer opposite the drift layer and adjacent to the base region;
wherein a multi-step negative bevel edge termination is formed in the base layer adjacent to the base region opposite the emitter mesa.

27. Silicon Carbide (SiC) semiconductor device having a blocking voltage of at least 10 kilovolts (kV), wherein the SiC semiconductor device is a Bipolar Junction Transistor (BJT) comprising:
a substrate of a first conductivity type;
a drift layer of a second conductivity type on a surface of the substrate;

a base layer of the first conductivity type on a surface of the drift layer opposite the substrate;
an emitter region of the second conductivity type on a surface of the base layer opposite the drift layer; and
a gate trench formed in a surface of the BJT adjacent to the emitter region and extending into the drift layer;
wherein a multi-step negative bevel edge termination is formed in the base layer adjacent to the emitter region opposite the gate trench.

28. A Silicon Carbide (SiC) semiconductor device having a blocking voltage of at least 10 1kilovolts (kV), wherein the SiC semiconductor device is a U-channel Metal-Oxide-Semiconductor Field Effect Transistor (UMOSFET) comprising:
   a substrate of a first conductivity type;
   a drift layer of the first conductivity type on a surface of the substrate;
   a base layer of a second conductivity type on a surface of the drift layer opposite the substrate;
   a source region of the first conductivity type on a surface of the base layer opposite the drift layer; and
   a gate trench formed in a surface of the UMOSFET adjacent to the source region and extending into the drift layer;
   wherein a multi-step negative bevel edge termination is formed in the base layer adjacent to the source region opposite the gate trench.

29. A Silicon Carbide (SiC) semiconductor device having a blocking voltage of at least 10 kilovolts (kV), wherein the SiC semiconductor device is a PIN diode comprising:
   a substrate of a first conductivity type;
   a drift layer of the first conductivity type on a surface of the substrate;
   a semiconductor layer of a second conductivity type on a surface of the drift layer opposite the substrate;
   an anode mesa on a surface of the semiconductor layer of the second conductivity type opposite the drift layer;
   an anode contact on a surface of the anode mesa opposite the drift layer; and
   a cathode contact on a surface of the substrate opposite the drift layer;
   wherein a multi-step negative bevel edge termination is formed in the semiconductor layer of the second conductivity type adjacent to the anode mesa.

* * * * *